(12) United States Patent
Wang et al.

(10) Patent No.: US 10,789,037 B2
(45) Date of Patent: Sep. 29, 2020

(54) HEARING PROTECTION METHOD, APPARATUS AND SYSTEM

(71) Applicant: SHENZHEN GRANDSUN ELECTRONIC CO., LTD., Shenzhen, Guangdong (CN)

(72) Inventors: Zhenli Wang, Shenzhen (CN); Shiwen Guo, Shenzhen (CN); Xin Yu, Shenzhen (CN); Haiquan Wu, Shenzhen (CN); Ruiwen Shi, Shenzhen (CN)

(73) Assignee: SHENZHEN GRANDSUN ELECTRONIC CO., LTD., Shenzhen (CN)

( * ) Notice: Subject to any disclaimer, the term of this patent is extended or adjusted under 35 U.S.C. 154(b) by 0 days.

(21) Appl. No.: 16/343,746

(22) PCT Filed: Mar. 24, 2017

(86) PCT No.: PCT/CN2017/078182
§ 371 (c)(1),
(2) Date: Apr. 19, 2019

(87) PCT Pub. No.: WO2018/072391
PCT Pub. Date: Apr. 26, 2018

(65) Prior Publication Data
US 2019/0278557 A1   Sep. 12, 2019

(30) Foreign Application Priority Data
Oct. 21, 2016  (CN) .......................... 2016 1 0920291

(51) Int. Cl.
*H03G 3/00* (2006.01)
*G06F 3/16* (2006.01)
(Continued)

(52) U.S. Cl.
CPC ................ *G06F 3/165* (2013.01); *G06F 3/16* (2013.01); *H03G 3/32* (2013.01); *H04R 3/00* (2013.01); *H04R 2430/01* (2013.01)

(58) Field of Classification Search
CPC .. G06F 3/165; G06F 3/16; H03G 3/32; H04R 3/00; H04R 2430/01
(Continued)

(56) References Cited

U.S. PATENT DOCUMENTS

| | | | |
|---|---|---|---|
| 2003/0002688 A1 | 1/2003 | Kanevsky et al. | |
| 2007/0253572 A1* | 11/2007 | Li | H04R 25/502 381/72 |
| 2013/0094658 A1* | 4/2013 | Holter | G10K 11/178 381/72 |

FOREIGN PATENT DOCUMENTS

| | | |
|---|---|---|
| CN | 104967932 | 10/2015 |
| CN | 105898650 | 8/2016 |
| CN | 106502618 | 3/2017 |

* cited by examiner

*Primary Examiner* — Ammar T Hamid
(74) *Attorney, Agent, or Firm* — Loza & Loza, LLP; Michael F. Fedrick

(57) ABSTRACT

A hearing protection method, an apparatus and a system are provided. the start command input by the user is received by the hearing protection apparatus to activate the hearing protection mode; the sound data in multiple dimensions is collected and whether the sound data in any of the dimensions is within a corresponding preset threshold is determined; and corresponding prompt information is sent when the sound data in any of the dimensions exceeds the corresponding preset threshold Thus, various prompting manners are provided to remind the user to make corresponding adjustments, thereby achieving the purpose of hearing protection, and effectively adapting to the needs of specific users.

15 Claims, 3 Drawing Sheets

(51) Int. Cl.
*H03G 3/32* (2006.01)
*H04R 3/00* (2006.01)

(58) Field of Classification Search
USPC .................................................. 381/107, 108
See application file for complete search history.

HEARING PROTECTION METHOD, APPARATUS AND SYSTEM

CROSS-REFERENCES TO RELATED APPLICATION

This application is the International Application No. PCT/CN2017/078182 for entry into US national phase with an international filing date of Mar. 24, 2017 designating US, now pending, and claims priority to Chinese Patent Application 201610920291.5, filed on Oct. 21, 2016, the content of which is incorporated herein by reference in its entirety.

TECHNICAL FIELD

The application relates to the field of mobile communication technologies, and in particular to a hearing protection method, a hearing protection apparatus and a hearing protection system.

BACKGROUND

At present, handheld smart devices such as tablets and smart phones have brought great convenience to people's lives and entertainment. The functions of the existing smart devices are not limited to entertainment, leisure, query materials, etc. More and more smart devices also have functions focusing on health, medical care, and sports monitoring. However, most smart devices currently focus on the monitoring of the user's heart rate, exercise volume and sleep quality, but lack the monitoring and protection mechanism for the user's ear hearing.

When people bring earphones to listen to music, to conduct conference calls and for other entertainment life, the user's ear may be exposed to various environments of the user's hearing physiological limitations for a long time, thereby causing damage to the user's ear hearing. The hearing protection method generally adopts a prompting method for prompting the user that the current volume is too large, to remind the user to perform volume adjustment. This prompting manner is single, and cannot effectively adapt to the needs of specific users.

SUMMARY

In view of this, the embodiments of the present application provide a hearing protection method, a device, and a system, to solve the problem that in current hearing protection method the user is only prompted that the current volume is too large, the prompt mode is single and cannot effectively adapt to the requirements of the specific user.

In a first aspect, an embodiment of the present invention provides a hearing protection method including:

receiving a start command input by the user to activate a hearing protection mode;

collecting sound data in multiple dimensions and determining whether the sound data in any of the dimensions is within a corresponding preset threshold; and sending corresponding prompt information when the sound data in any of the dimensions exceeds the corresponding preset threshold.

In a second aspect, an embodiment of the present invention provides a hearing protection apparatus including a receiver, a data collector and a processor, where:

the receiver is configured to receive a start command input by the user to activate a hearing protection mode;

the data collector is configured to collect sound data in multiple dimensions and to determine whether the sound data in any of the dimensions is within a corresponding preset threshold; and the processor is configured to send corresponding prompt information when the sound data in any of the dimensions exceeds the corresponding preset threshold.

In a second aspect, an embodiment of the present invention provides hearing protection system, including a processor, a communication interface, a memory and a bus, where:

the processor, the communication interface and the memory communicate with each other through the bus;

the communication interface is configured to communicate with a music device;

and the processor is configured to execute a program;

wherein the program comprises:

a receiver, configured to receive a start command input by the user to activate the hearing protection mode;

a data collector, configured to collect sound data in multiple dimensions and to determine whether the sound data in any of the dimensions is within a corresponding preset threshold; and a processor, configured to send corresponding prompt information when the sound data in any of the dimensions exceeds the corresponding preset threshold.

In an embodiment of the present application, the start command input by the user is received by the hearing protection apparatus to activate the hearing protection mode; the sound data in multiple dimensions is collected and whether the sound data in any of the dimensions is within a corresponding preset threshold is determined; and corresponding prompt information is sent when the sound data in any of the dimensions exceeds the corresponding preset threshold Thus, various prompting manners are provided to remind the user to make corresponding adjustments, thereby achieving the purpose of hearing protection, and effectively adapting to the needs of specific users.

DESCRIPTION OF THE EMBODIMENTS

The technical solutions in the embodiments of the present application will be clearly and completely described in conjunction with the drawings in the embodiments of the present application. The embodiments are merely a part of the embodiments of the application, and not all of the embodiments. All other embodiments obtained by a person of ordinary skill in the art based on the embodiments of the present application without paying creative efforts are within the scope of the present application.

The implementation of the present application is described in detail below with reference to specific embodiments.

Embodiment 1

It should be understood that, in the embodiments of the present application, the size of the sequence numbers of the processes does not mean the order of execution sequence, and the execution order of each process should be determined by its function and internal logic, and the sequence numbers should not form any limit to the implementation processes of the embodiments of the present application.

Figure 1:
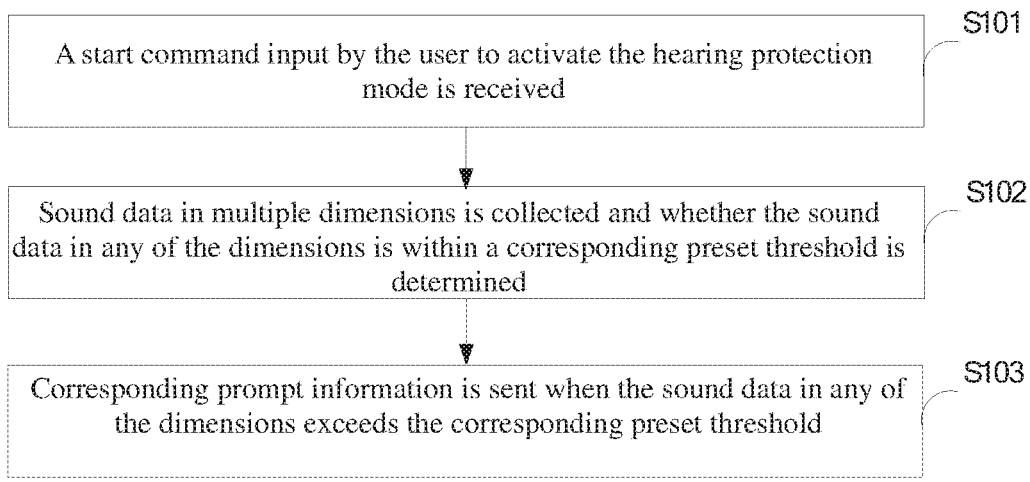
FIG. 1 is a flowchart showing an implementation process of a hearing protection method according to Embodiment 1 of the present application.

FIG. 1 is a flowchart showing an implementation process of a hearing protection method according to Embodiment 1 of the present invention, which is described in detail as follows:

In step S101, a start command input by the user to activate the hearing protection mode is received.

In the embodiment of the present application, when the hearing protection apparatus is turned on, an operation button for a start command is displayed on the screen of the device, and when the user clicks, double-clicks or sliding touches the operation button the hearing protection mode is activated. Of course, the user can alternatively use voice to activate the hearing protection mode, which is not limited here.

In step S102, sound data in multiple dimensions is collected and whether the sound data in any of the dimensions is within a corresponding preset threshold is determined.

In the embodiment of the present application, the sound data in multiple dimensions includes a device-played sound volume, an ambient noise volume, and a heard sound duration. The preset threshold corresponding to the device-played sound volume is a preset volume threshold, the preset threshold corresponding to the noise volume is a preset noise threshold, and the sound data in any of the dimensions is set with one or more preset thresholds.

Specifically, the preset time threshold corresponding to the heard sound duration is a preset threshold interval, and the preset threshold interval is a set of different time thresholds set by noise volume ranges which are divided according to the ambient noise volume, a number of the time thresholds being consistent with a total number of the divided noise volume ranges. For example, the ambient noise volume of 60 dB or less is divided into a noise interval, and the time threshold of its corresponding heard sound duration is 3 hours; the ambient noise volume of 61 dB to 70 dB is divided into another noise interval, and the time threshold of its corresponding heard sound duration is 2 hours; the ambient noise volume of 71 dB to 85 dB is divided into another noise interval, and the time threshold of its corresponding heard sound duration is 1 hour and 45 minutes; and the ambient noise volume of 111 dB to 120 dB is divided into another noise interval, and the time threshold of its corresponding heard sound duration is 5 minutes. The division of the specific noise intervals and the preset time thresholds of their corresponding heard sound durations may be determined according to long-term statistics, or may be determined according to an experiment or personal experience of a user, or may be determined according to a certain function formula, which is not specifically limited herein.

It should be understood that the greater the ambient noise volume, the shorter the corresponding heard sound duration, that is, the ambient noise volume is inversely proportional to the heard noise duration.

Specifically, the device-played sound volume is a volume value actually output by the device when an audio and video file, such as music, recording, video, or the like, is played or a call is made by the current device.

Specifically, the ambient noise volume is an actual ambient noise volume of the current location of the user, and when the location of the user changes, the ambient noise volume may change greatly.

Specifically, the heard sound duration includes a heard device-sound duration and a heard noise duration, where:

the heard device-sound duration is the heard sound duration timed based on the device-played sound volume after the hearing protection mode is activated;

Specifically, the heard device-sound duration is generally understood to be the total heard sound duration of the user at different ambient noise volumes. When the hearing protection mode is activated, the user's listening time is counted. In order to accurately collect the heard sound duration of the user, the heard sound duration of the user is generally collected based on the device-played sound volume. The heard sound duration of the user in the heard device-sound duration is specifically the time period from the device starting to play at a volume to the device stopping to play at a volume.

The heard noise duration is the heard sound duration timed based on the ambient noise volume when the ambient noise volume is greater than a preset noise threshold after the hearing protection mode is activated;

When it is detected that the ambient noise volume changes and the heard noise duration before the ambient noise volume changes does not exceed a preset time threshold corresponding to the ambient noise volume before the change occurs, the heard noise duration before the ambient noise volume changes is saved and timing based on the ambient noise volume after the change is started;

The ratio of the heard noise duration before the change occurs to a preset time threshold of the ambient noise volume before the change occurs is calculated to obtain a conversion coefficient;

In the embodiment of the present application, the calculation formula of the conversion coefficient is as follows:

$$\text{conversion coefficient} = \text{heard noise duration before the change occurs} \div \text{the preset time threshold for the ambient noise volume before the change occurs.}$$

A pre-heard noise duration is calculated according to the conversion coefficient and a preset time threshold for the ambient noise volume after the change, the pre-heard noise duration and the heard noise duration being timed are accumulated, and whether the accumulated duration exceeds the preset time threshold corresponding to the ambient noise volume after the change occurs is determined.

In the embodiment of the present application, the pre-heard noise duration is obtained by converting the heard noise duration before the change occurs to the heard noise duration that has been listened after the change and accumulating the heard noise duration being timed, which can avoid the fact that under different ambient noise volumes the actual heard sound duration of the user exceeds any preset time threshold corresponding to different ambient noise volumes, which can achieve the purpose of more effectively protecting the user's hearing.

The formula for calculating the pre-heard noise duration is as follows:

the pre-heard noise duration=the preset time threshold for the ambient noise volume after the change×conversion coefficient.

It should be understood that the heard device-sound duration and the heard noise duration are a group of parallel. Generally, the preset time threshold corresponding to the heard device-sound duration is greater than the preset time threshold corresponding to the heard noise duration.

In an application scenario, the user is located in the equipment room, the current ambient noise volume is 80 dB, and the preset time threshold corresponding to the ambient noise volume of 80 dB is 1 hour and 45 minutes. When the user has continuously listened for 1 hour at the current ambient noise volume, suddenly a device fails, emits a very loud noise, the entire room becomes very noisy, the detected current ambient noise volume is 95 dB, and the corresponding preset time threshold is 47 minutes when the preset ambient noise volume is 95 dB; at this time, the conversion coefficient S equals to 60 minutes divided by 105 minutes (1 hour 45 minutes), which is 0.57, the pre-noise duration T equals to 47 minutes multiplied by 0.57, which is 26.79 minutes, which is equivalent to that the user's heard sound duration under the ambient noise volume of 95 dB is 26.79 minutes, then the user's actual available heard sound duration T' under the ambient noise volume of 95 dB equals to 47 minutes minus 26.79 minutes, which is 20.21 minutes. In other words, when the currently being timed duration reaches 20.21 minutes, the time threshold of 47 minutes for the ambient noise volume of 95 dB is reached.

In another application scenario, the user is located in the equipment room, the current ambient noise volume is 80 dB, and the preset time threshold corresponding to the ambient noise volume of 80 dB is 1 hour and 45 minutes. When the user has been continuously listening for 1 hour at the current ambient noise volume, the user leaves the equipment room and enters a quiet office, the current ambient noise volume is detected to be 50 dB, and the corresponding preset time threshold is 3 hours when the preset ambient noise volume is 50 dB; at this time, the conversion coefficient S1 equals to 60 minutes divided by 105 minutes (1 hour 45 minutes), which is 0.57, the pre-noise duration T1 equals to 180 minutes multiplied by 0.57, which is 102.6 minutes, which is equivalent to that the user's heard sound duration under the ambient noise volume of 50 dB is 102.6 minutes, after the user listens for 30 minutes in the quiet office, the accumulated heard sound duration reaches 132.6 minutes, which does not exceed the preset time threshold for the ambient noise volume of 50 dB. At this time, the user returns to the equipment room with the ambient noise volume of 80 dB and continues to listen, the conversion coefficient S2 equals to 132 minutes divided by 180 minutes, which is 0.57 and the pre-noise duration T2 equals to 105 minutes multiplied by 0.74, which is 77.7 minutes. When the user continues listening for 27.3, the time threshold of 1 hour and 45 minutes for the ambient noise volume of 80 dB is reached.

In another application scenario, the user is located in the equipment room, the current ambient noise volume is 110 dB, and the preset time threshold corresponding to the ambient noise volume of 110 dB is 10 minutes. When the user has continuously listened for 5 minutes at the current ambient noise, the user enters another equipment room. At this time, the current ambient noise volume is 120 dB, and the preset time threshold corresponding to the ambient noise volume of 120 dB is 5 minutes, then when the user listens for 2.5 minutes in the equipment room with an ambient noise volume of 120 dB, the preset time threshold of 5 minutes for the ambient noise volume of 120 dB is reached.

Specifically, the heard noise duration may also be understood as the high-intensity heard sound duration, which generally refers to the total duration that the user has listened to at an ambient noise volume higher than a preset noise threshold.

In step S103, corresponding prompt information is sent when the sound data in any of the dimensions exceeds the corresponding preset threshold.

In the embodiment of the present application, the prompt information may be voice prompt information or text prompt information, which is not limited herein.

Specifically, when the device-played sound volume is greater than a preset volume threshold, the hearing protection apparatus sends corresponding prompt information. For example, when the user adjusts the device-played sound volume to 80 dB or more, a dialog box will pop up, prompting the user that "The current playing volume is beyond the comfort level acceptable to the human ear and it is recommended to lower the volume to protect your hearing!"

When the ambient noise volume is greater than the preset noise threshold, the hearing protection apparatus sends a corresponding prompt message. For example, when the ambient noise of the user's current location is 90 dB, a dialog box will pop up, prompting the user that "Your current environment is 90 dB noise zone and it is recommended to turn on the earphone noise reduction function to protect your hearing!".

When any one of the heard device-sound duration or the heard noise duration reaches the corresponding preset time threshold, the hearing protection apparatus sends a corresponding prompt message.

In an application scenario, when it is detected that the device playing timing reaches the preset time threshold of 3 hours, that is, when the listening time of the user exceeds 3 hours, a dialog box pops up, prompting the user that "your currently listening time has been more than 3 hours, in order to protect your hearing, please pay attention to rest, you can massage the yifeng point near the earlobe (the depression between the earlobe and the high bone behind the ear) and tinghui point (in front of the tragus, the depression of the posterior edge of the mandibular joint) each 30 times, which can increase the blood circulation of the inner ear and protect the hearing."

When the heard noise duration exceeds a preset time threshold corresponding to the noise interval of the current ambient noise volume, the corresponding prompt information is sent.

In an application scenario, when the collected current ambient noise volume is 120 dB, and the preset time threshold corresponding to the ambient noise volume of 120 dB is 5 minutes, when the listening time of the user under this ambient noise volume reaches 5 minutes, a dialog box will pop up, prompting the user that "Your time in the harmful noise range of 120 dB is beyond the range that the human ear can bear and it is recommended to turn on the earphone noise reduction function to protect your hearing, or find a quiet place to rest and adjust."

In another application scenario, the user is located in the equipment room, the current ambient noise volume is 90 dB, and the preset time threshold corresponding to the preset noise interval for the ambient noise volume of 90 dB is 1 hour. When the user has been continuously listening for 30 minutes in the current ambient noise, the user leaves the equipment room and enters a quiet office, the current ambient noise volume is detected to be 50 dB, the preset time threshold corresponding to the preset noise interval for the ambient noise volume of 50 dB is 3 hours. At this time, when the user has continuously listened for 1 hour and 30 minutes, a dialog box will pop up, prompting the user that "your current heard sound duration has exceeded the range that the human ear can bear, in order to protect your hearing, please pay attention to rest, you can massage the yifeng point near the earlobe (the depression between the earlobe and the high bone behind the ear) and tinghui point (in front of the tragus, the depression of the posterior edge of the mandibular joint) each 30 times, which can increase the blood circulation of the inner ear and protect the hearing."

In the embodiment of the present application, the start command input by the user is received by the hearing protection apparatus to activate the hearing protection mode; the sound data in multiple dimensions is collected and whether the sound data in any of the dimensions is within a corresponding preset threshold is determined; and corresponding prompt information is sent when the sound data in any of the dimensions exceeds the corresponding preset threshold Thus, various prompting manners are provided to remind the user to make corresponding adjustments, thereby achieving the purpose of hearing protection, and effectively adapting to the needs of specific users.

Embodiment 2

Figure 2:
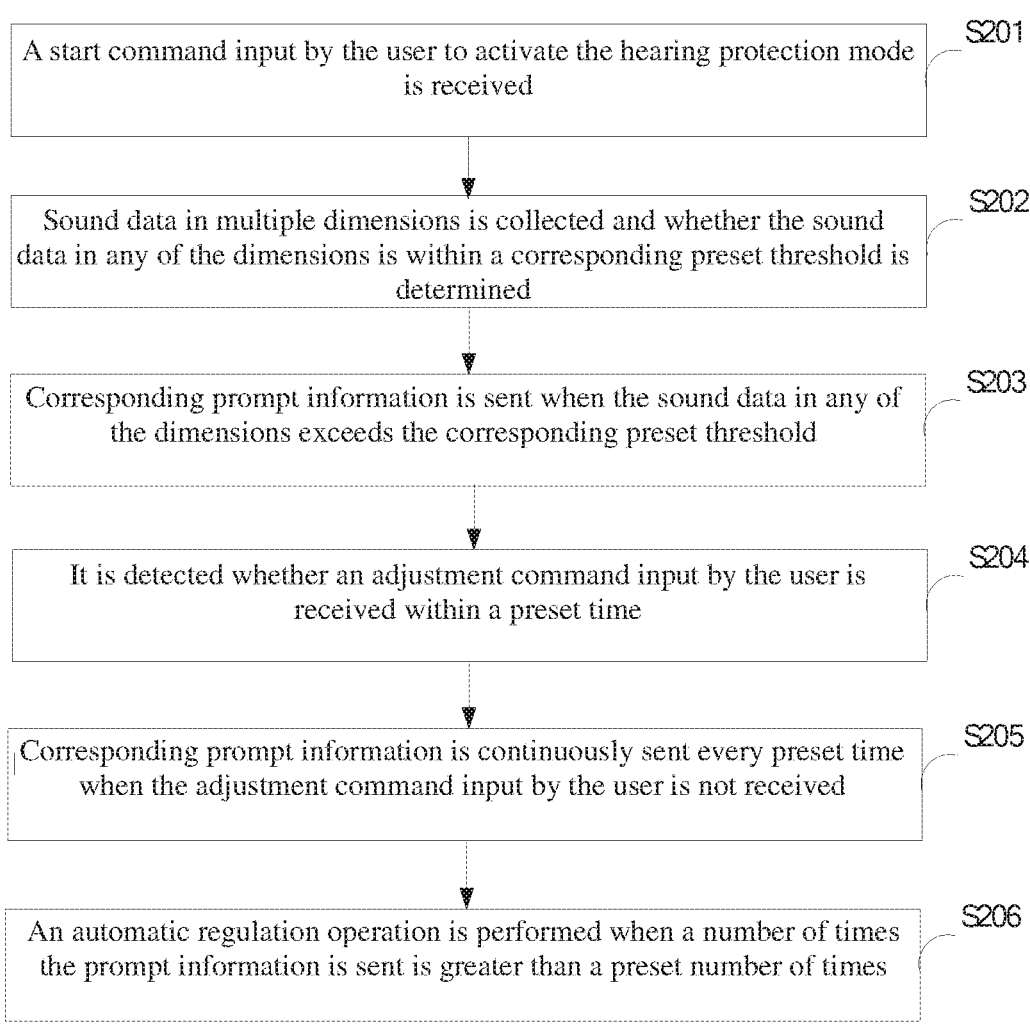
FIG. 2 is a flowchart showing an implementation process of another hearing protection method according to Embodiment 2 of the present application.

FIG. 2 is a flowchart showing an implementation process of another hearing protection method according to Embodiment 2 of the present application, which is described in detail as follows:

In step S201, a start command input by the user to activate the hearing protection mode is received.

In step S202, sound data in multiple dimensions is collected and whether the sound data in any of the dimensions is within a corresponding preset threshold is determined.

In step S203, corresponding prompt information is sent when the sound data in any of the dimensions exceeds the corresponding preset threshold.

In step S204, it is detected whether an adjustment command input by the user is received within a preset time.

In the embodiment of the present application, the adjustment command includes a volume lowering command, an earphone noise reduction function enabling command, a current status maintenance command, or a listening suspension command.

Specifically, the volume lowering command may be that the user decrease the volume through the volume adjustment function of the earphone, or the user decreases the volume through the volume adjustment function key of the device, or decreases the volume through the volume adjustment function key in the hearing protection apparatus;

When the earphone used by the user has the noise reduction function, the earphone noise reduction function enabling command may be input to perform noise reduction processing;

The current status maintenance command refers to a command input when the user does not perform corresponding adjustment, and the command may be set in the hearing protection apparatus;

The listening suspension command includes clicking the abort button in the audio or video software, directly closing the audio or video software, hanging up the phone or the like.

In step S205, corresponding prompt information is continuously sent every preset time when the adjustment command input by the user is not received.

In the embodiment of the present application, in order to prevent the situation that the user has no time to make corresponding adjustment due to negligence or busy work, it is set to remind the user once every 5 minutes (where the time is not limited).

In step S206, an automatic regulation operation is performed when a number of times the prompt information is sent is greater than a preset number of times.

In the embodiment of the present application, in order to avoid repeatedly prompting the user so as to occupy system resources, it is set that when the reminders to the user reaches a certain number of times, the device automatically performs an automatic control operations, such as lowering the volume, automatically stopping the playing of the audio or video files, maintaining current status or interrupting the connection of the earphone with the device.

In the embodiment of the present application, when the sound data in any of the dimensions exceeds the preset threshold and the corresponding prompt information is sent, the corresponding adjustment action is performed based on the detection of whether the adjustment command input by the user is received. By repeatedly reminding the user to make the adjustment, the prompting effect of hearing protection is effectively improved, and the purpose of reducing system resources is achieved through the automatic control command, which gives users a better experience.

Embodiment 3

Figure 3:
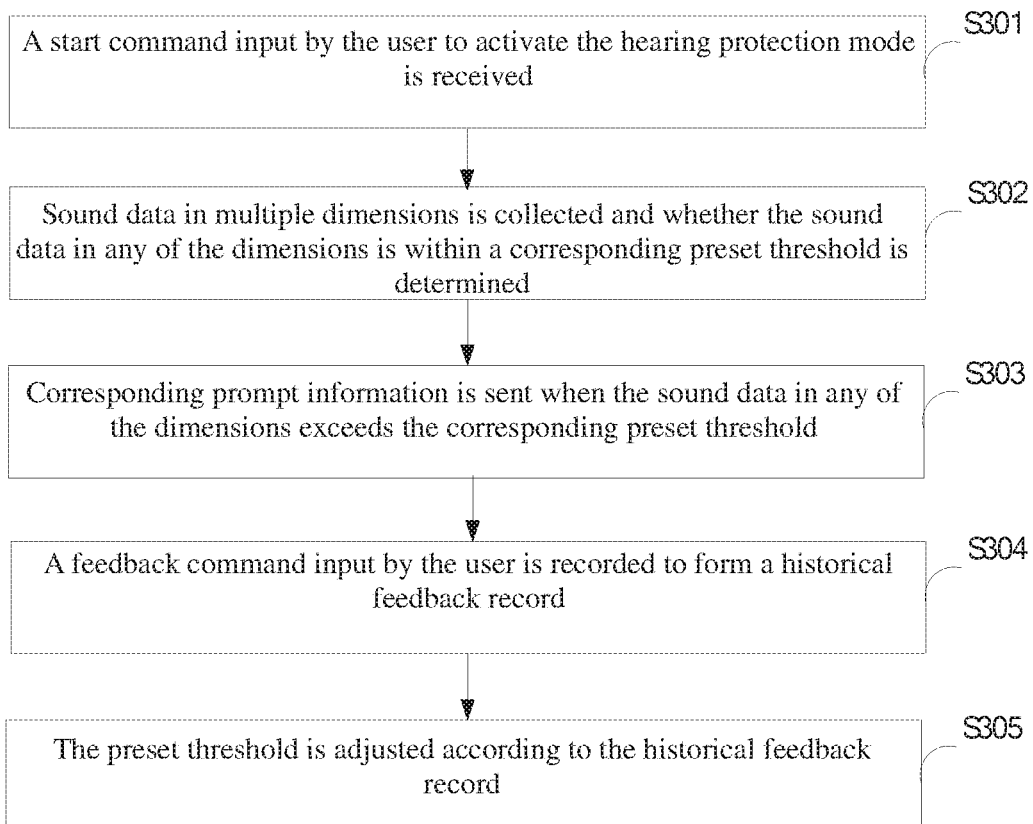
FIG. 3 is a flowchart showing an implementation process of another hearing protection method according to Embodiment 3 of the present application.

FIG. 3 is a flowchart showing an implementation process of another hearing protection method according to Embodiment 3 of the present application, which is described in detail as follows:

In step S301, a start command input by the user to activate the hearing protection mode is received.

In step S302, sound data in multiple dimensions is collected and whether the sound data in any of the dimensions is within a corresponding preset threshold is determined.

In step S303, corresponding prompt information is sent when the sound data in any of the dimensions exceeds the corresponding preset threshold.

In step S304, a feedback command input by the user is recorded to form a historical feedback record.

In the embodiment of the present application, the feedback command refers to an action command that the user performs corresponding adjustment when the device-played sound volume is too high; and the historical feedback record refers to multiple volume records formed by recording the user adjusts or does not adjust the device-played sound volume.

In step S305, the preset threshold is adjusted according to the historical feedback record.

In the embodiment of the present application, the preset threshold refers to a preset volume threshold of the device-played sound volume.

In an application scenario, when the user uses the earphone to listen, the comfortable volume for the ear is not higher than 60 dB. When the device-played sound volume currently set by the user is 90 dB, the device will output a prompt that the listening volume is too large. When it is recorded that the user does not adjust the volume multiple times or the device-played sound volume adjusted by the user for several times is 90 dB, it is determined that the comfortable volume for the ear that the user feels is not higher than 90 dB, and the hearing protection apparatus will adjust the preset volume threshold of the device-played sound volume to be 90 dB.

In the embodiment of the present application, by using the historical feedback record to automatically adjust the preset volume threshold of the device-played sound volume, the device can adapt to the listening requirements of different users, and the purpose of the hearing protection is achieved, thereby giving the users a better experience.

Embodiment 4

Figure 4:
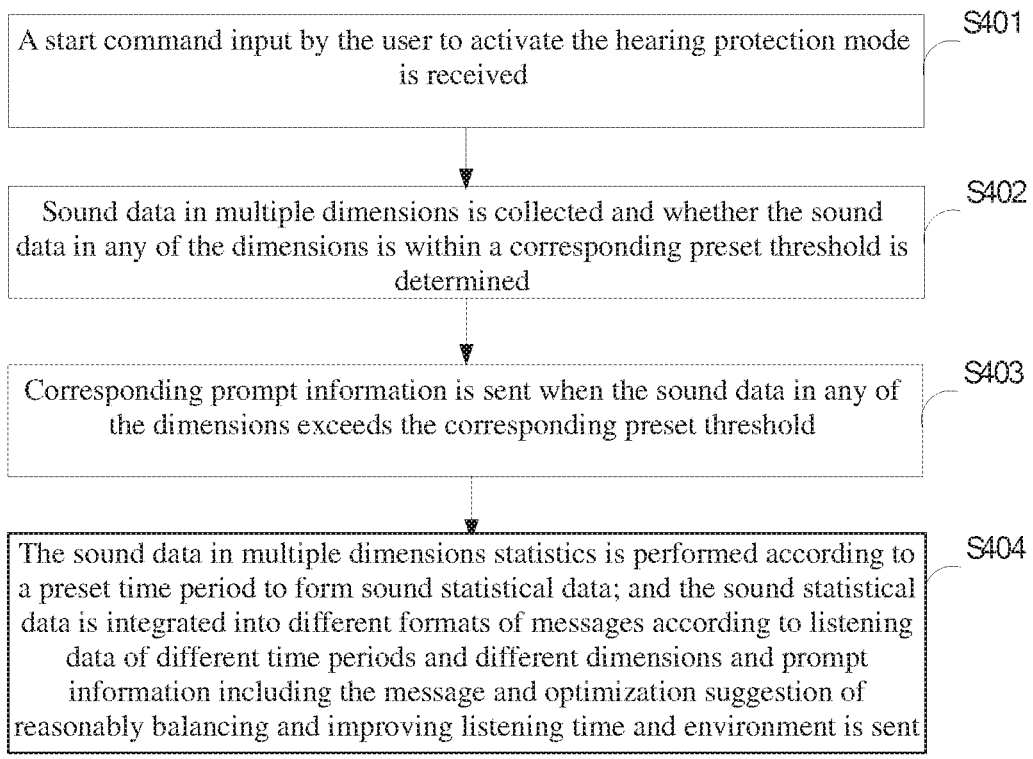
FIG. 4 is a flowchart showing an implementation process of another hearing protection method according to Embodiment 4 of the present application.

FIG. 4 is a flowchart showing an implementation process of another hearing protection method according to Embodiment 4 of the present application, which is described in detail as follows:

In step S401, a start command input by the user to activate the hearing protection mode is received.

In step S402, sound data in multiple dimensions is collected and whether the sound data in any of the dimensions is within a corresponding preset threshold is determined.

In step S403, corresponding prompt information is sent when the sound data in any of the dimensions exceeds the corresponding preset threshold.

In step S404, the sound data in multiple dimensions statistics is performed according to a preset time period to form sound statistical data; and the sound statistical data is integrated into different formats of messages according to sound data of different time periods and different dimensions and prompt information including the message and optimization suggestion of reasonably balancing and improving listening time and environment is also sent.

In the embodiment of the present application, the message formed according to the listening statistics is similar to the physical examination report, and the user can learn the data of his daily listening according to the message, and fundamentally solve the problem of hearing protection. In order to improve human-computer interaction, the hearing protection apparatus also gives optimization suggestion of reasonably balancing and improving listening time and environment according to the sound statistical data, and gives the user a better experience with the professional optimization suggestion.

Specifically, the format of the message may be in the form of a table, or may be composed of texts and numbers.

In the embodiment of the present application, collecting sound data in multiple dimensions to form the sound statistical data can give the user a more intuitive understanding so as to understand his own historical listening condition, and can obtain better hearing protection effect according to the optimization suggestion of the hearing protection apparatus.

A person skilled in the art can clearly understand that for the convenience and brevity of the description, the specific working process of the above described methods and steps can refer to the corresponding processes in the method and the step embodiment, and details are not described herein again.

A person skilled in the art can understand that all or part of the steps of implementing the method in foregoing embodiments may be completed by a program to instruct related hardware, and the corresponding program may be stored in a computer readable storage medium, the storage medium may be such as ROM/RAM, disk, CD or the like.

Embodiment 5

Figure 5:
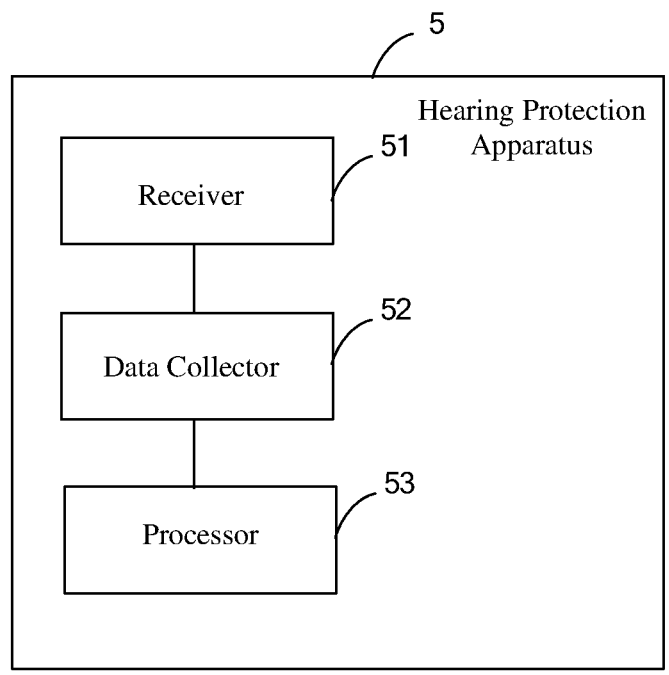
FIG. 5 is a structural block diagram of a hearing protection apparatus according to Embodiment 5 of the present application.

FIG. 5 is a block diagram showing a specific structure of the hearing protection apparatus 5 according to Embodiment 5 of the present application, which is used to operate the hearing protection method described in FIGS. 1 to 4. For convenience of description, only the parts related to the embodiment of the present application are shown.

The hearing protection apparatus 5 according to the embodiment of the present application includes a receiver 51, a data collector 52 and a processor 53; where the receiver 51 is configured to receive a start command input by the user to activate a hearing protection mode;

the data collector 52 is configured to collect sound data in multiple dimensions and to determine whether the sound data in any of the dimensions is within a corresponding preset threshold;

the processor 53 is configured to send corresponding prompt information when the sound data in any of the dimensions exceeds the corresponding preset threshold.

Specifically, the sound data in multiple dimensions includes a device-played sound volume, an ambient noise volume, and a heard sound duration.

Further, the heard sound duration data includes a heard device-sound duration and a heard noise duration, where:

the heard device-sound duration is the heard sound duration data timed based on the device-played sound volume after the hearing protection mode is activated;

and the heard noise duration is the heard sound duration timed based on the ambient noise volume when the ambient noise volume is greater than a preset noise threshold after the hearing protection mode is activated Further, the processor comprises:

a first transmitter, configured to send corresponding prompt information when the heard device-sound duration exceeds a preset time threshold;

a second transmitter, configured to send corresponding prompt information when the heard noise duration exceeds a preset time threshold corresponding to the ambient noise volume;

a first processor, configured to save the heard noise duration before the ambient noise volume changes and start timing based on the ambient noise volume after the change when it is detected that the ambient noise volume changes and the heard noise duration before the ambient noise volume changes does not exceed a preset time threshold corresponding to the ambient noise volume before the change occurs;

a calculator, configured to calculate a ratio of the heard noise duration before the change occurs to a preset time threshold of the ambient noise volume before the change occurs to obtain a conversion coefficient; and a second processor, configured to calculate a pre-heard noise duration according to the conversion coefficient and a preset time threshold corresponding to the ambient noise volume after the change, to accumulate the pre-heard noise duration and the heard noise duration being timed, and to send corresponding prompt information when the accumulated duration exceeds the preset time threshold corresponding to the ambient noise volume after the change.

Specifically, the preset time threshold corresponding to the heard sound duration is a preset threshold interval, and the preset threshold interval is a set of different time thresholds set by noise volume ranges which are divided according to the ambient noise volume, a number of the time thresholds being consistent with a total number of the divided noise volume ranges.

Furthermore, the apparatus further includes a detector, an alerter, and an controller; where the detector is configured to detect whether an adjustment command input by the user is received within a preset time;

the alerter is configured to continuously send corresponding prompt information every preset time when the adjustment command input by the user is not received;

the controller is configured to perform an automatic regulation operation when a number of times the prompt information is sent is greater than a preset number of times.

Furthermore, the apparatus further includes a recorder and a adjustor:

the recorder is configured to record a feedback command input by the user to form a historical feedback record;

the adjustor is configured to adjust the preset threshold according to the historical feedback record.

The hearing protection apparatus according to the embodiment of the present application may be disposed in a device such as a mobile phone, a computer, or a tablet, which is not limited herein.

In the embodiment of the present application, the start command input by the user is received by the receiver 51 of the hearing protection apparatus to activate the hearing protection mode; the sound data in multiple dimensions is collected by the data collector 52 and whether the sound data in any of the dimensions is within a corresponding preset threshold is determined; and corresponding prompt information is sent by the processor 53 when the sound data in any of the dimensions exceeds the corresponding preset threshold. Thus, various prompting manners are provided to remind the user to make corresponding adjustments, thereby achieving the purpose of hearing protection, and effectively adapting to the needs of specific users.

Figure 6:
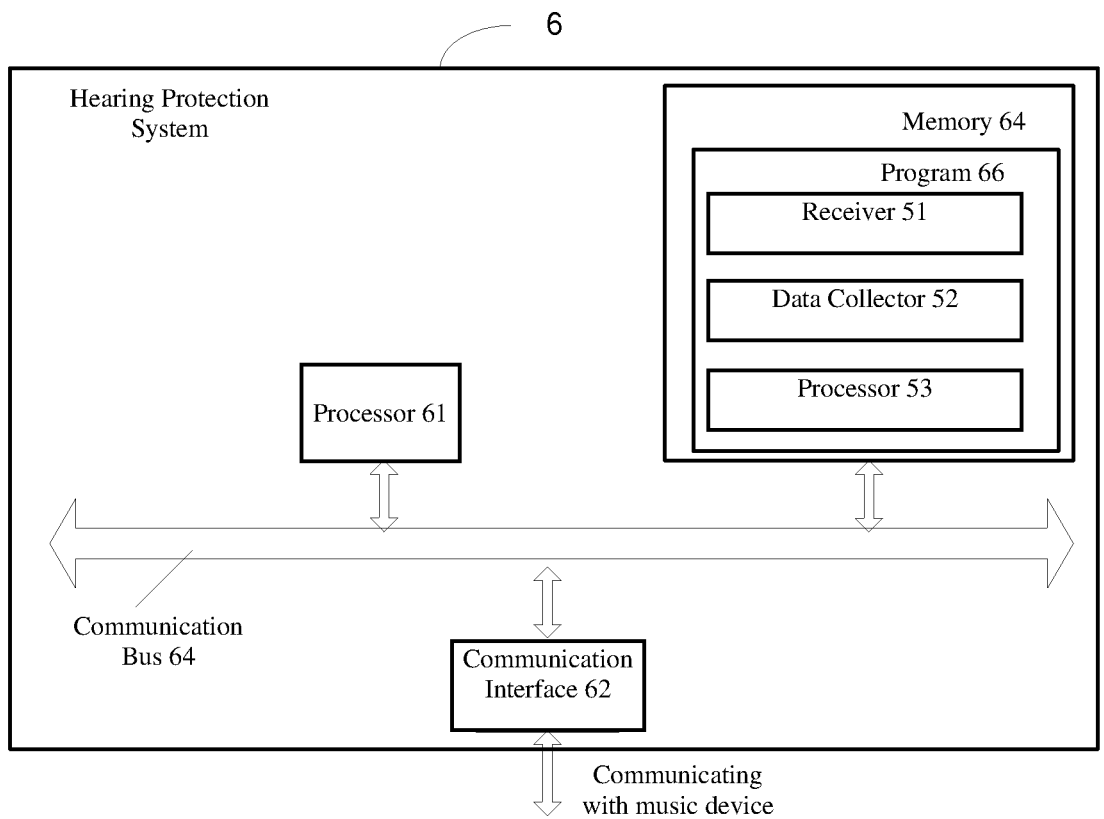
FIG. 6 is a schematic diagram of a hearing protection system 6 according to Embodiment 6 of the present application.

FIG. 6 is a schematic diagram of a hearing protection system 6 according to an embodiment of the present application. The hearing protection system 6 may be a host server including computing ability, or a personal computer PC, or a portable computer or terminal, etc. The specific embodiments of the present application do not limit the specific implementation of the hearing protection system. The hearing protection system 6 includes:

a processor 61, a communication interface 62, a memory 64, and a bus 64.

The processor 61, the communication interface 62 and the memory 63 communicate with each other through the bus 64.

The communication interface 62 is configured to communicate with a music device.

The processor 61 is configured to execute a program 66.

Specifically, the program 66 may include program code, which includes computer operating instructions.

The processor 61 may be a central processing unit (CPU), or an Application Specific Integrated Circuit (ASIC), or one or more integrated circuits configured to implement embodiments of the present application.

The memory 63 is used to store the program 66. The memory 63 may include a high speed RAM memory and may also include a non-volatile memory such as at least one disk memory. The program 66 may include:

a receiver 51, configured to receive a start command input by the user to activate the hearing protection mode;

a data collector 52, configured to collect sound data in multiple dimensions and to determine whether the sound data in any of the dimensions is within a corresponding preset threshold; and a processor 53, configured to send corresponding prompt information when the sound data in any of the dimensions exceeds the corresponding preset threshold.

Furthermore, the program 66 may further include:

a detector, configured to detect whether an adjustment command input by the user is received within a preset time;

an alerter, configured to continuously send corresponding prompt information every preset time when the adjustment command input by the user is not received; and an controller, configured to perform an automatic regulation operation when a number of times the prompt information is sent is greater than a preset number of times.

Furthermore, the program 66 may further include:

a recorder, configured to record a feedback command input by the user to form a historical feedback record; and a adjustor, configured to adjust the preset threshold according to the historical feedback record.

For the specific implementation of each unit in the program 66, reference may be made to the corresponding unit in the embodiment shown in FIG. 6, and details are not described herein.

It can be clearly understood by the one of ordinary skill in the art that, for describing conveniently and concisely, dividing of the aforesaid various functional units, functional modules is described exemplarily merely, in an actual application, the aforesaid functions can be assigned to different functional units and functional modules to be accomplished, that is, an inner structure of a data synchronizing device is divided into functional units or modules so as to accomplish the whole or a part of functionalities described above. The various functional units, modules in the embodiments can be integrated into a processing unit, or each of the units exists independently and physically, or two or more than two of the units are integrated into a single unit. The aforesaid integrated unit can by either actualized in the form of hardware or in the form of software functional units. In addition, specific names of the various functional units and modules are only used for distinguishing from each other conveniently, but not intended to limit the protection scope of the present application. Regarding a specific working process of the units and modules in the aforesaid device, reference can be made to a corresponding process in the aforesaid method embodiments, it is not repeatedly described herein.

In the aforesaid embodiments, the description of each of the embodiments is emphasized respectively, regarding a part of one embodiment which isn't described or disclosed in detail, please refer to relevant descriptions in some other embodiments.

The ordinarily skilled one in the art may aware that, the elements and algorithm steps of each of the examples described in connection with the embodiments disclosed herein can be implemented in electronic hardware, or in combination with computer software and electronic hardware. Whether these functions are implemented by hardware or software depends on the specific application and design constraints of the technical solution. The skilled people could use different methods to implement the described functions for each particular application, however, such implementations should not be considered as going beyond the scope of the present application.

It should be understood that, in the embodiments of the present application, the disclosed device/terminal device and method could be implemented in other ways. For example, the device described above are merely illustrative; for example, the division of the units is only a logical function division, and other division could be used in the actual implementation, for example, multiple units or components could be combined or integrated into another system, or some features can be ignored, or not performed. In another aspect, the coupling or direct coupling or communication connection shown or discussed could be through some interfaces, and indirect coupling or communication connection between devices or units may be electrical, mechanical, or in other manners.

The units described as separate components could or could not be physically separate, the components shown as units could or could not be physical units, which can be located in one place, or can be distributed to multiple network elements. Parts or all of the elements could be selected according to the actual needs to achieve the object of the present embodiment.

In addition, the various functional units in each of the embodiments of the present application can be integrated into a single processing unit, or exist individually and physically, or two or more than two units are integrated into a single unit. The aforesaid integrated unit can either be achieved by hardware, or be achieved in the form of software functional units.

If the integrated unit is achieved in the form of software functional units, and is sold or used as an independent product, it can be stored in a computer readable storage medium. Based on such understanding, the technical solution of the embodiments of the present application may contribute to the prior art or all or part of the technical solution may be embodied in the form of a software product which is stored in a storage and includes a plurality of commands for causing a computer device (which may be a personal computer, a server, or a network device, etc.) or a processor to perform all or part of the steps of the methods described in various embodiments of the embodiments of the present application. The foregoing storage medium includes: a U disk, a mobile hard disk, a read-only memory (ROM), a random access memory (RAM), a magnetic disk, or an optical disk, and the like.

As stated above, the aforesaid embodiments are only intended to explain but not to limit the technical solutions of the present application. Although the present application has been explained in detail with reference to the above-described embodiments, it should be understood for the ordinary skilled one in the art that, the technical solutions described in each of the above-described embodiments can still be amended, or some technical features in the technical solutions can be replaced equivalently; these amendments or equivalent replacements, which won't make the essence of corresponding technical solution to be broken away from the spirit and the scope of the technical solution in various embodiments of the present application, should all be included in the protection scope of the present application.

What is claimed is:

1. A hearing protection method, comprising:
receiving a start command input by the user to activate a hearing protection mode;
collecting sound data in multiple dimensions and determining whether the sound data in any of the dimensions is within a corresponding preset threshold; and
sending corresponding prompt information when the sound data in any of the dimensions exceeds the corresponding preset threshold;
wherein, after said sending corresponding prompt information, the method further comprises:
detecting whether an adjustment command input by the user is received within a preset time;
continuously sending corresponding prompt information every preset time when the adjustment command input by the user is not received; and
performing an automatic regulation operation when a number of times the prompt information is sent is greater than a preset number of times.

2. The method according to claim 1 wherein the sound data in multiple dimensions comprises a device-played sound volume, an ambient noise volume, and a heard sound duration.

3. The method according to claim 2, wherein the heard sound duration data comprises a heard device-sound duration and a heard noise duration, wherein:
the heard device-sound duration is the heard sound duration data timed based on the device-played sound volume after the hearing protection mode is activated; and
the heard noise duration is the heard sound duration timed based on the ambient noise volume when the ambient noise volume is greater than a preset noise threshold after the hearing protection mode is activated.

4. The method according to claim 3, wherein said sending corresponding prompt information when the sound data in any of the dimensions exceeds the corresponding preset threshold comprises:
sending corresponding prompt information when the heard device-sound duration exceeds a preset time threshold;
sending corresponding prompt information when the heard noise duration exceeds a preset time threshold corresponding to the ambient noise volume;
saving the heard noise duration before the ambient noise volume changes and starting timing based on the ambient noise volume after the change when it is detected that the ambient noise volume changes and the heard noise duration before the ambient noise volume changes does not exceed a preset time threshold corresponding to the ambient noise volume before the change occurs;
calculating a ratio of the heard noise duration before the change occurs to a preset time threshold of the ambient noise volume before the change occurs to obtain a conversion coefficient; and
calculating a pre-heard noise duration according to the conversion coefficient and a preset time threshold for the ambient noise volume after the change, accumulating the pre-heard noise duration and the heard noise duration being timed, and sending corresponding prompt information when the accumulated duration exceeds the preset time threshold corresponding to the ambient noise volume after the change occurs.

5. The method according to claim 3, wherein the preset time threshold corresponding to the heard sound duration is a preset threshold interval, and the preset threshold interval is a set of different time thresholds set by noise volume ranges which are divided according to the ambient noise volume, a number of the time thresholds being consistent with a total number of the divided noise volume ranges.

6. The method according to claim 1, wherein, after said sending corresponding prompt information, the method further comprises:
recording a feedback command input by the user to form a historical feedback record; and
adjusting the preset threshold according to the historical feedback record.

7. A hearing protection apparatus, comprising:
a receiver, configured to receive a start command input by the user to activate a hearing protection mode;
a data collection unit collector, configured to collect sound data in multiple dimensions and to determine whether the sound data in any of the dimensions is within a corresponding preset threshold; and a processor, configured to send corresponding prompt information when the sound data in any of the dimensions exceeds the corresponding preset threshold;

wherein the apparatus further comprises:

a detector, configured to detect whether an adjustment command input by the user is received within a preset time;

an alerter, configured to continuously send corresponding prompt information every preset time when the adjustment command input by the user is not received; and a controller, configured to perform an automatic regulation operation when a number of times the prompt information is sent is greater than a preset number of times.

8. The apparatus according to claim 7, wherein the sound data in multiple dimensions comprises a device-played sound volume, an ambient noise volume, and a heard sound duration.

9. The apparatus according to claim 8, wherein the heard sound duration data comprises a heard device-sound duration and a heard noise duration, wherein:

the heard device-sound duration is the heard sound duration data timed based on the device-played sound volume after the hearing protection mode is activated; and the heard noise duration is the heard sound duration timed based on the ambient noise volume when the ambient noise volume is greater than a preset noise threshold after the hearing protection mode is activated.

10. The apparatus according to claim 9 wherein the processor comprises:

a first transmitter, configured to send corresponding prompt information when the heard device-sound duration exceeds a preset time threshold;

a second transmitter, configured to send corresponding prompt information when the heard noise duration exceeds a preset time threshold corresponding to the ambient noise volume;

a first processor, configured to save the heard noise duration before the ambient noise volume changes and start timing based on the ambient noise volume after the change when it is detected that the ambient noise volume changes and the heard noise duration before the ambient noise volume changes does not exceed a preset time threshold corresponding to the ambient noise volume before the change occurs;

a calculator, configured to calculate a ratio of the heard noise duration before the change occurs to a preset time threshold of the ambient noise volume before the change occurs to obtain a conversion coefficient; and a second processor, configured to calculate a pre-heard noise duration according to the conversion coefficient and a preset time threshold corresponding to the ambient noise volume after the change, to accumulate the pre-heard noise duration and the heard noise duration being timed, and to send corresponding prompt information when the accumulated duration exceeds the preset time threshold corresponding to the ambient noise volume after the change.

11. The apparatus according to claim 9, wherein the preset time threshold corresponding to the heard sound duration is a preset threshold interval, and the preset threshold interval is a set of different time thresholds set by noise volume ranges which are divided according to the ambient noise volume, a number of the time thresholds being consistent with a total number of the divided noise volume ranges.

12. The apparatus according to claim 7, further comprising:

a recorder, configured to record a feedback command input by the user to form a historical feedback record; and an adjustor, configured to adjust the preset threshold according to the historical feedback record.

13. The method according to claim 1, wherein, after said sending corresponding prompt information, the method further comprises:

performing sound data in multiple dimensions statistics according to a preset time period to form sound statistical data; and integrating the sound statistical data into different formats of messages according to sound data of different time periods and different dimensions and sending prompt information including the message and optimization suggestion of reasonably balancing and improving listening time and environment.

14. The method according to claim 1, wherein the adjustment command is selected from a group consisting of a volume lowering command, an earphone noise reduction function enabling command, a current status maintenance command, and a listening suspension command.

15. The apparatus according to claim 7, wherein the adjustment command is selected from a group consisting of a volume lowering command, an earphone noise reduction function enabling command, a current status maintenance command, and a listening suspension command.

* * * * *